United States Patent
Kuehn et al.

(10) Patent No.: US 9,882,600 B2
(45) Date of Patent: Jan. 30, 2018

(54) SWITCHING DEVICE, A COMMUNICATION DEVICE, AND A METHOD FOR PROCESSING A CARRIER

(71) Applicant: Infineon Technologies AG, Neubiberg (DE)

(72) Inventors: Christian Kuehn, Munich (DE); Martin Bartels, Munich (DE); Henning Feick, Dresden (DE); Dirk Offenberg, Dresden (DE); Anton Steltenpohl, Munich (DE); Hans Taddiken, Munich (DE); Ines Uhlig, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 378 days.

(21) Appl. No.: 14/172,925

(22) Filed: Feb. 5, 2014

(65) Prior Publication Data
US 2015/0222317 A1    Aug. 6, 2015

(51) Int. Cl.
*H04B 1/00*     (2006.01)
*H04B 1/44*     (2006.01)
(Continued)

(52) U.S. Cl.
CPC ............. *H04B 1/44* (2013.01); *H01L 21/324* (2013.01); *H01L 29/1079* (2013.01); *H01L 29/78* (2013.01)

(58) Field of Classification Search
USPC ........ 455/78, 83, 286, 127.1, 255, 333, 341, 455/127.3, 126, 115.3; 257/347, 349,
(Continued)

(56) References Cited

U.S. PATENT DOCUMENTS 4,065,783 A    12/1977 Ouyang
6,583,024 B1    6/2003 Kononchuk et al.
(Continued)

FOREIGN PATENT DOCUMENTS

CN    102265402 A    11/2011
CN    103198950 A    7/2013
(Continued)

OTHER PUBLICATIONS

Randy Wolf et al., Highly Resistive Substrate CMOS on SOI for Wireless Front-End Switch Applications, CS Mantech Conference, May 16-19, 2011.
(Continued)

*Primary Examiner* — Ganiyu A Hanidu
(74) *Attorney, Agent, or Firm* — Viering, Jentschura & Partner mbB

(57) ABSTRACT

According to various embodiments, a switching device may include: an antenna terminal; a switch including a first switch terminal and a second switch terminal, the first switch terminal coupled to the antenna terminal, the switch including at least one transistor at least one of over or in a silicon region including an oxygen impurity concentration of smaller than about $3 \times 10^{17}$ atoms per $cm^3$; and a transceiver terminal coupled to the second switch terminal, wherein the transceiver terminal is at least one of configured to provide a signal received via the antenna terminal or configured to receive a signal to be transmitted via the antenna terminal.

18 Claims, 7 Drawing Sheets

(51) Int. Cl.
*H01L 21/324* (2006.01)
*H01L 29/78* (2006.01)
*H01L 29/10* (2006.01)

(58) Field of Classification Search
USPC ....... 257/371, 506, 288, 328, 476, 330, 471, 257/655, 343
See application file for complete search history.

(56) References Cited

U.S. PATENT DOCUMENTS

| | | | |
|---|---|---|---|
| 7,879,699 B2 | 2/2011 | Schulze et al. | |
| 8,131,225 B2* | 3/2012 | Botula | H01L 27/1203 257/349 |
| 9,100,060 B2 | 8/2015 | Ilkov | |
| 2005/0179093 A1* | 8/2005 | Morris | H01L 21/761 257/371 |
| 2007/0246752 A1* | 10/2007 | Cheng | H01L 29/78603 257/288 |
| 2008/0034335 A1* | 2/2008 | Cheng | H01L 29/78603 257/506 |
| 2009/0087631 A1* | 4/2009 | Schulze | H01L 21/263 428/213 |
| 2013/0069712 A1* | 3/2013 | Trajkovic | H01L 29/7816 327/537 |
| 2013/0154761 A1* | 6/2013 | Ilkov | H03H 7/465 333/101 |
| 2014/0003000 A1* | 1/2014 | McPartlin | H01L 29/732 361/728 |
| 2014/0284701 A1* | 9/2014 | Korec | H01L 29/7824 257/328 |

FOREIGN PATENT DOCUMENTS

| | | |
|---|---|---|
| KR | 20090033123 A | 4/2009 |
| KR | 20130069444 A | 6/2013 |
| WO | 2010075051 A1 | 7/2010 |

OTHER PUBLICATIONS

Zhiping Feng et al., High-Performance Solenoidal RF Transformers on High-Resistivity Silicon substrates, IEEE Transactions on Microwave Theory and Techniques, Band 60, Nr. 7, pp. 2066-2072, Jul. 2012.

C. Roda Neve et al., Rf and linear performance for commercial 200mm trap-rich HR-SOI wafers for SoC applications, 13th Topical Meeting on Silicon Monolithic Integrated Circuits in RF Systems, pp. 15-17.

Ben Ali et al., Impact of Crosstalk into High Resistivity Silicon Substrate on the RF performance of SOI MOSFET, Journal of Telecommunications and Information Technology, Nr.4/2010, pp. 93-100.

Bullis, Current trends in silicon defect technology, Materials Science and Engineering B72, 2000, pp. 93-98.

RF Switches, Infineon Technologies, http://www.infineon.com/cms/en/product/channel.html?channel=db3a304314dca389011502f07fe10b7b, 2013.

Float Zone Wafers (fz), Silicon Valley Microelectronic, Inc, http://www.svmi.com/de/silizium-wafer/floatzone-wafer-fz/, May 25, 2013.

* cited by examiner

SWITCHING DEVICE, A COMMUNICATION DEVICE, AND A METHOD FOR PROCESSING A CARRIER

TECHNICAL FIELD

Various embodiments relate generally to a switching device, a communication device, and a method for processing a carrier.

BACKGROUND

In general, electronic devices such as transistors, diodes, integrated circuits and the like may be highly efficient in handling directed currents (DC). A metal-oxide-semiconductor field-effect transistor (MOSFET) may be used for switching electronic signals. Passive RF components, e.g. wiring structures or coils, may require a carrier having a high electrical resistivity. Further, great efforts are being made to design efficient switches handling RF (radio frequency or microwave) signals, an RF voltage, and/or an RF current. General approaches may focus on reducing the resistivity of the substrate below the passive RF components and forming active RF components (e.g. MOSFETs) over electrically isolated regions in the carrier using for example silicon-on-insulator (SOI) technology. In this context, an active RF component (e.g. a SOI MOSFET) may be formed over a buried oxide region (BOX) to reduce parasitic influences of the substrate on the RF characteristics of the active RF component. However, this technology may be difficult to handle and/or costly in the manufacturing process.

SUMMARY

According to various embodiments, a switching device may include: an antenna terminal; a switch including a first switch terminal and a second switch terminal, the first switch terminal coupled to the antenna terminal, the switch including at least one transistor at least one of over or in a silicon region including an oxygen impurity concentration of smaller than about $3 \times 10^{17}$ atoms per $cm^3$; and a transceiver terminal coupled to the second switch terminal, wherein the transceiver terminal is at least one of configured to provide a signal received via the antenna terminal or configured to receive a signal to be transmitted via the antenna terminal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
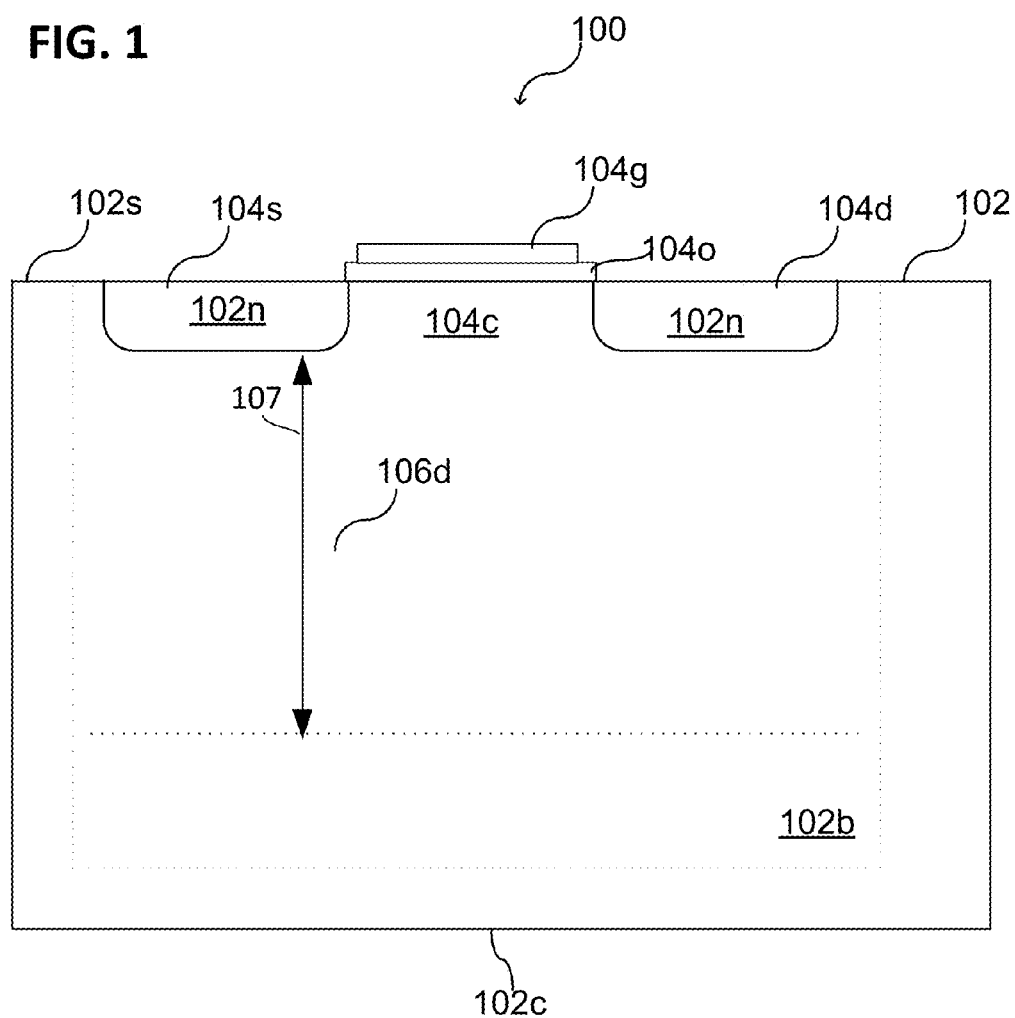
FIG. 1 shows an electronic device in a schematic cross sectional view, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In general, the design of an electronic circuit with active and passive components may depend on the desired application. The electronic properties of the components may greatly depend on whether the components may be operated with directed voltage and directed current (DC or DC power) or with alternating voltage and alternating current (AC or AC power). Wherein a capacity causes negligible resistances and capacitive losses at DC power or AC power with low frequencies, e.g. at frequencies smaller than about 1 kHz, capacitive losses become crucial at high frequencies, e.g. at frequencies in the RF range (e.g. in the range from about 3 kHz to about 300 GHz).

Due the non-linearity of the capacitive resistances, the generation of higher harmonics may reduce the efficiency of the electronic components operating RF power (RF current and RF voltage). Therefore, to operate RF power with semiconductor components, e.g. passive components, like coils and metal lines, and active components, like switches, transistors, or diodes (PIN diodes), an adapted design may be provided. Thereby, passive components may be formed in an electrically insulating substrate such that the substrate is substantially free of charge carriers which otherwise might cause a large non-linear capacitive resistance. In contrast thereto, forming active components may be more difficult, since the carrier may need for example a doping to provide parts of the active components, e.g. a p-n-junction of a transistor or of a diode. Further, manufacturing transistors and/or diodes may be difficult since during the processing temperatures may be used to activate thermal induced doping which might change the desired properties of the transistors and/or diodes. Due to thermally induced doping, an originally p-type doped region in the carrier may be changed for example into n-type doping such that the functionality of an electronic component may be at least reduced.

A conventional approach for active components may include the use of SOI-substrates or GaAs substrates for manufacturing RF switches. In addition to the high costs associated with this approach, an integration of a logic circuit may be more difficult using these substrates, or otherwise the RF switches may not fulfill a predetermined specification for the maximal generation of harmonic oscillations. In other words, by using conventional technologies it may be necessary to choose between high cost and performance loss.

According to various embodiments, a switch (e.g. an RF switch) may be provided having a high linearity. The generation of higher harmonics (e.g. the second and/or third harmonic oscillation) may be suppressed for example down to $H_2$ smaller than about −85 dBm and $H_3$ smaller than about −105 dBm at an input power $P_{in}$ of about 25 dBm.

According to various embodiments, the used power unit dBm (or dBmW) for the input power $P_{in}$ and the power of the generated harmonics $H_2$ and $H_3$ is related to the power ratio in decibels (dB) of the measured power referenced to one milliwatt (mW).

According to various embodiments, an RF switch may be provided in silicon bulk material (e.g. in a silicon wafer), wherein the RF switch may have a low power attenuation and may have a low generation of higher harmonics and also a low distortion of an operated RF signal. The RF switch may be manufactured in at least one of the following semiconductor technologies: MOS technology (metal oxide semiconductor technology), nMOS technology (n-channel MOS technology), pMOS technology (p-channel MOS technology), CMOS technology (complementary metal oxide semiconductor technology). Alternatively, the RF switch may include a PIN diode (positive intrinsic negative diode).

According to various embodiments, the RF switch provided herein may allow efficiently operating RF current and RF voltage in the frequency range from 100 MHz to 60 GHz. According to various embodiments, one or more RF switches, as described herein, may be included in a communication device. Further, according to various embodiments, one or more RF switches, as described herein, may be (e.g. monolithically) integrated in a carrier together with a logic circuit operating the one or more RF switches.

According to various embodiments, the RF switch or the switching device may be or may include a single-pole-single-throw (SPIT) switch for routing a signal (e.g. an RF signal) from one antenna terminal (single-pole) to one transceiver terminal (single-throw) or from one transceiver terminal to one antenna terminal. Illustratively, the RF switch may work as an on-off switch. According to various embodiments, the RF switch or the switching device may be or may include a single-pole-double-throw (SPDT) switch for routing a signal (e.g. an RF signal) from one antenna terminal (single-pole) to two transceiver terminals (double-throw) or from two transceiver terminals to one antenna terminal. According to various embodiments, the RF switch or the switching device may be or may include a single-pole-multiple-throw (SPnT with n larger than two) switch for routing a signal (e.g. an RF signal) from one antenna terminal (single-pole) to n transceiver terminals (multiple-throw) or from n transceiver terminals to one antenna terminal (n in general being an arbitrary integer number). Referring to this, the RF switch or the switching device may include analogously a double-pole, e.g. two antenna terminals for connecting two antennas, or even a multiple-pole for connecting a plurality of antennas.

According to various embodiments, a method for processing a carrier or a wafer is provided herein, e.g. for manufacturing a switching device or a communication device. According to various embodiments, a communication device may include a wireless communication device based for example on standards like WiFi, Bluetooth, GSM (Global System for Mobile Communications), GPRS (General Packet Radio Services), EDGE (Enhanced Data Rate for GSM Evolution), UMTS (Universal Mobile Telecommunications System), W-CDMA (Wideband Code Division Multiple Access), HSDPA (High Speed Downlink Packet Access), HSPA+ (High Speed Packet Access+), LTE (Long Term Evolution), LTE-Advanced (Long Term Evolution-Advanced), or any other communication based on RF signals, e.g. satellite communication. Further, according to various embodiments, the RF switch may be used in applications and devices using radar (RAdio Detection And Ranging).

In bulk silicon material oxygen is dissolved, wherein the concentration of oxygen impurities or the concentration of dissolved oxygen may depend or the minimal concentration of dissolved oxygen may be limited by the wafer growth process, e.g. CZ material or CZ wafers manufactured using a Czochralski wafer growth process.

CZ wafers or silicon with an oxygen concentration of larger than about $3 \times 10^{17}$ atoms per $cm^3$ may not be suitable for processing high quality (see e.g. FIG. 2) RF switches in MOS technology (in bulk silicon), independent of the electrical resistance of the wafer prior to the processing. Depending on the thermal budget introduced into the wafer during processing, the material oxygen can be activated by thermal processes as a donor. Thus, the bulk silicon may contain more free charge carriers as being allowable to manufacture an RF switch with the desired RF characteristic.

In addition, the impedance of the wafer (the silicon) may change from an initially high impedance (e.g. with a specific electrical resistance of the p-type doped silicon is larger than about 100 Ωcm) to an actually lower impedance (e.g. n-doped due to the activated oxygen donors). Since from a certain point during processing the maximal processable temperatures are limited, a so-called thermal donor kill process, e.g. requiring temperatures of about 800° C., may not be applicable. This may lead to a nominal p-type substrate is in fact locally changed to a lightly doped n-type substrate. Accordingly, the p-n junctions may leak, that is, the leakage current in the reverse direction is getting larger or the switch may even not work with RF power.

According to various embodiments, there may be a limit for the maximal allowable oxygen concentration in the silicon material, e.g. at least in the active regions of the p-n-junction (in the depletion zone).

According to various embodiments, silicon may be used for manufacturing the switch (or e.g. a transistor arrangement for RF applications), wherein the silicon has a low oxygen concentration, e.g. as in FZ material or FZ wafers manufactured via a floating zone (FZ) process. Alternatively, a silicon layer may be deposited over a carrier, wherein the silicon of the silicon layer has a low oxygen concentration. The silicon layer may be thicker than about 10 μm, or thicker than about 20 μm, or thicker than about 30 μm. In this case, the surface region of the carrier or the wafer may include silicon with a low oxygen concentration, e.g. independent of the carrier or the wafer.

The silicon layer may be an epitaxially grown silicon layer, so-called epitaxial silicon layer, e.g. using a chemical vapor deposition (CVD) process (e.g. PECVD, plasma enhanced CVD) or a physical vapor deposition (PVD) process (e.g. atomic layer deposition, sputtering, molecular beam epitaxy).

According to various embodiments, using a silicon carrier with a low oxygen content (e.g. with an oxygen impurity concentration of smaller than about $3 \times 10^{17}$ atoms per $cm^3$, e.g. with an oxygen impurity concentration of smaller than about $2 \times 10^{17}$ atoms per $cm^3$, e.g. with an oxygen impurity concentration of smaller than about $1\times10^{17}$ atoms per cm$^3$), the carrier may be processed in commonly used CMOS technology.

The linearity of a transistor and the corresponding metal leads (e.g. the metallization) may be restricted by the presence of free charge carriers (electrons and holes) in the bulk silicon. In addition, the leakage current through the Source/Drain Bulk-junctions of the RF switch transistor contributes to the generation of harmonic oscillations, wherein the RF switch transistor may be located directly in the bulk. In oxygen-containing silicon thermal donors may be activated by thermal processes during the manufacturing process, which may change the net resistance of the bulk locally and can even lead to a doping reversal, e.g. from p-type doping to n-type doping.

According to various embodiments, a reduced oxygen content in the silicon may allow avoiding the above described effects. Further, it allows using substrates with a larger specific electrical resistance.

Both methods, using FZ wafers or depositing a silicon layer, have in common that the silicon bulk material is highly resistive and the oxygen content is sufficiently low to avoid a substantial thermal activation of donors, e.g. occurring for example during annealing at temperatures in the range from about 250° C. to about 550° C. (or in the range from about 350° C. to about 450° C.) e.g. with an annealing time larger than about one minute (or e.g. larger than about five minutes, or e.g. larger than about 20 minutes).

According to various embodiments, the oxygen concentration of the silicon may not influence the manufacture of passive components, e.g. metal lines or coils, since their doping effects may not substantially affect the charge carrier transport, since the silicon bulk material may not be involved into the charge carrier transport.

According to various embodiments, it was recognized that float-zone-material (FZ) may have an oxygen impurity concentration being sufficiently small to manufacture active RF components, as described herein, without substantially activating thermal donors during the CMOS processing.

The use of oxygen-depleted bulk silicon material allows further improvements regarding the linearity of the transistor since the additional effects are not overlapped from the bulk influence. According to various embodiments, forming an RF switch in bulk silicon may be cheaper than the complex SOI processing.

According to various embodiments, an RF switch, as described herein, may support a variety of applications, such as single pole multi throw switches (e.g. for general purpose switching, band/mode switching and antenna diversity applications), double pole double throw (DPDT) switches and antenna switch modules (ASM). Further, the RF switch may be implemented as discrete TSLP (Thin Small Leadless Package) or TSNP (Thin Small Non Leaded Package) packaged components or the RF switch may be implemented in chip-scale-packages (CSP). The control may be implemented in many different ways. However, upcoming designs are moving away from traditional general purpose input/output (GPIO) to Mobile Industry Processor Interface (MIPI) RFFE programmable interface.

FIG. 1 illustrates a schematic cross sectional view of a carrier 102 including a transistor. According to various embodiments, the transistor may include a p-n-junction formed by the body material 102b of the carrier 102 and one or more doped regions 102n in the carrier 102. Accordingly, a depletion region 106d (also called depletion layer, depletion zone, junction region, space charge region or space charge layer) is formed, wherein mobile charge carriers (electrons and holes) have been diffused with or without an applied electric field. Remaining charges and/or charge carriers which may be left in the depletion region 106d may be ionized donor and/or acceptor impurities.

Illustratively, the characteristics of the depletion region 106d, like doping homogeneity, the spatial extension, the remaining charge carriers, the electrical resistance and the like, may contribute to the RF characteristic of the transistor (switch). According to various embodiments, the depth of the depletion region 106d may be defined by the doping level of the body material 102b forming the body region of the transistor and the doping level of the one or more doped regions 102n in the carrier 102, wherein the body region 102b and the one or more doped regions 102n forming a p-n-junction. Therefore, the depletion region may be disturbed by a thermal activation of oxygen as donor and the RF properties of the transistor may degrade.

Further, the one or more doped regions 102n forming a channel 104c and an electrically isolated gate 104g may be disposed over the channel to switch the transistor between a conducting and a non-conducting state. Thereby, the one or more doped regions 102n provide the source/drain (S/D) of the transistor.

The gate 104g may be disposed over a gate oxide 104o (or a dielectric layer), e.g. via a PVD or CVD process. According to various embodiments, the gate 104g may include an electrically conductive gate material, e.g. doped polysilicon, a metal or an alloy, wherein the gate oxide 104o may include a dielectric material, e.g. silicon oxide or a high-κ-material (with a larger permittivity than silicon oxide). According to various embodiments, the gate 104g may include silicon, wherein the doping of the gate 104 may be performed in the very same doping process being used for doping the one or more doped regions 102n. A doping process may include ion implantation and a thermal treatment for activating the implanted ions and/or a doping process may include thermal diffusing dopant material.

According to various embodiments, the carrier 102 or at least the region of the carrier 102 in which the transistor is formed and/or in which the depletion region 106d of the transistor (or of the p-n-junction) extends may include (p-type or n-type doped) silicon with an oxygen impurity concentration of smaller than about $3\times10^{17}$ atoms per cm$^3$. Since the silicon in the body region 102b shall form a part of the p-n-junction and since a depth 107 of the depletion region 106d shall be large to achieve the desired RF characteristics of the transistor, the body region 102b may include a low doping level and the one or more doped regions 102n may include a high opposite doping level than the body region 102b.

According to various embodiments, the body region 102b (the silicon region 102b) may include p-type doped silicon with a doping concentration in the range from about $10^{12}$ cm$^{-3}$ to about $10^{14}$ cm$^{-3}$, e.g. in the range from about $5\times10^{12}$ cm$^{-3}$ to about $5\times10^{13}$ cm$^{-3}$, e.g. in the range from about $10^{13}$ cm$^{-3}$, wherein the one or more doped regions 102n (the source region and the drain region) may be n-type doped silicon with a doping concentration in the range from about $10^{15}$ cm$^{-3}$ to about $10^{23}$ cm$^{-3}$, e.g. in the range from about $10^{17}$ cm$^{-3}$ to about $10^{22}$ cm$^{-3}$, e.g. in the range from about $10^{18}$ cm$^{-3}$ to about $10^{21}$ cm$^{-3}$, e.g. in the range from about $10^{19}$ cm$^{-3}$ to about $10^{20}$ cm$^{-3}$.

According to various embodiments, the body region 102b (the silicon region 102b) may include n-type doped silicon with a doping concentration in the range from about $10^{12}$ cm$^{-3}$ to about $10^{14}$ cm$^{-3}$, e.g. in the range from about $5\times10^{12}$ cm$^{-3}$ to about $5\times10^{13}$ cm$^{-3}$, e.g. in the range from about $10^{13}$ cm$^{-3}$, wherein the one or more doped regions 102n (the source region 104s and the drain region 104d) may be p-type doped silicon with a doping concentration in the range from about 10$^{15}$ cm$^{-3}$ to about 10$^{23}$ cm$^{-3}$, e.g. in the range from about 10$^{17}$ cm$^{-3}$ to about 10$^{22}$ cm$^{-3}$, e.g. in the range from about 10$^{18}$ cm$^{-3}$ to about 10$^{21}$ cm$^{-3}$, e.g. in the range from about 10$^{19}$ cm$^{-3}$ to about 10$^{20}$ cm$^{-3}$.

Therefore, according to various embodiments, the depletion region 106d may have for example a depth 107 (or vertical extension 107) in the range from about 1 µm to about 50 µm, e.g. in the range from about 3 µm to about 40 µm, e.g. in the range from about 5 µm to about 20 µm. According to various embodiments, the depth 107 may be the extension perpendicular to the surface 102s of the carrier 102 or the silicon layer 102. According to various embodiments, the surface 102s may be the main processing surface.

According to various embodiments, the doped silicon forming the body region 102b, in which the depletion region extends, may have for example a specific electrical resistance of larger than about 100 Ωcm, or e.g. larger than about 500 Ωcm, or for example larger than about 1 kΩcm. The maximal allowable oxygen concentration in the body region 102b may depend on the desired specific electrical resistance taking the doping into account. If the specific electrical resistance of the body region 102b is larger than about 100 Ωcm, the oxygen impurity concentration may be smaller than about $3\times10^{17}$ atoms per cm$^3$; if the specific electrical resistance of the body region 102b is larger than about 500 Ωcm, the oxygen impurity concentration may be smaller than about $2\times10^{17}$ atoms per cm$^3$; and if the specific electrical resistance of the body region 102b is larger than about 1000 Ωcm, the oxygen impurity concentration may be smaller than about $1\times10^{17}$ atoms per cm$^3$.

According to various embodiments, the typically occurring nitrogen and carbon impurities in FZ wafers may not substantially influence the RF characteristics of the switch 100. According to various embodiments, one or more switches 100 or transistors 100 may be formed in the carrier 102, in a row next to each other such that the drain region of a first transistor may be the source region of a second transistor. Further, the transistor may be operated by applying an RF voltage (signal) between the source 104s, of the transistor and the backside 102c of the carrier such that the signal can be transferred through the channel 104c when the transistor is switched on. According to various embodiments, one or more isolating regions may be formed in the carrier 102, e.g. laterally surrounding the transistor to electrically isolate the transistor from the edges of the carrier preventing a short circuit of the transistor to the backside 102c of the carrier 102.

According to various embodiments, the switch 100 (or transistor) described herein, may be capable to efficiently operate RF signals in a frequency range from about 100 MHz to about 10 GHz (or even lower or higher), or e.g. in a frequency range from about 500 MHz to about 6 GHz, or e.g. in a frequency range from about 700 MHz to about 3 GHz.

Figure 2:
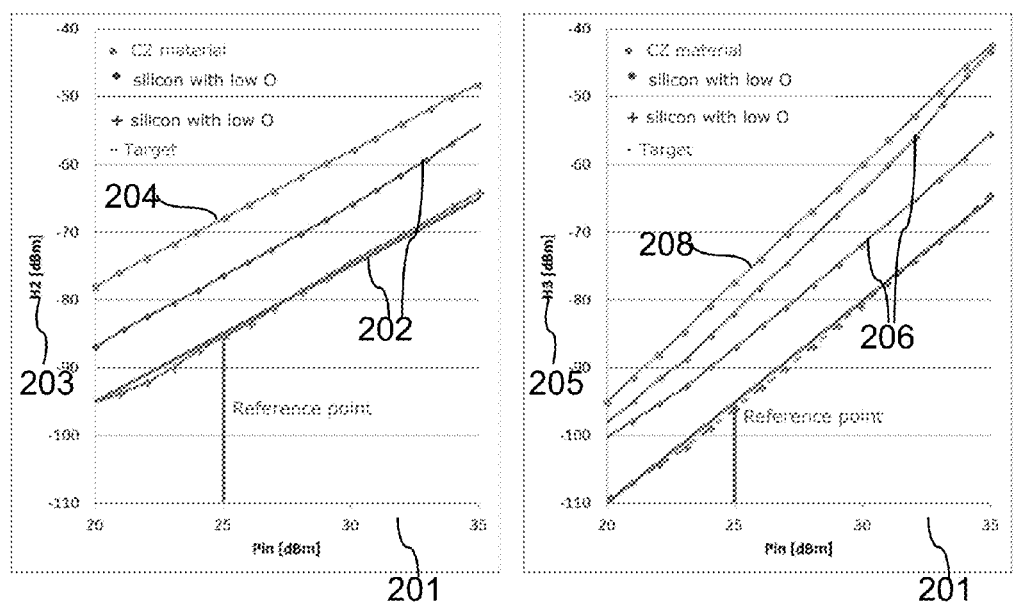
FIG. 2 illustrates the RF properties of a switching component or a switching device, according to various embodiments.

In FIG. 2 the power H$_2$ of the generated second harmonic 203 and the power H$_3$ of the generated third harmonic 205 are respectively illustrated in dependence of the input power P$_{in}$ 201 to the transistor or switch 100 (e.g. measured with a base frequency of about 800 MHz). As illustrated, the power of the generated second harmonic of switches manufactured with silicon having a low oxygen content 202 is less compared to commonly manufactured switches 100 on CZ wafers 204. Further, the power of the generated third harmonic of switches manufactured with silicon having a low oxygen content 206 is less compared to commonly manufactured switches 100 on CZ wafers 208.

Various modifications and/or configurations of the switch 100 and details referring to a switching device and communication device are described in the following, wherein the features and/or functionalities described referring to FIGS. 1 and 2 may be included analogously. Further, the features and/or functionalities described in the following may be included in the switch 100 or may be combined with the switch 100, as described before referring to FIGS. 1 and 2.

Figure 3:
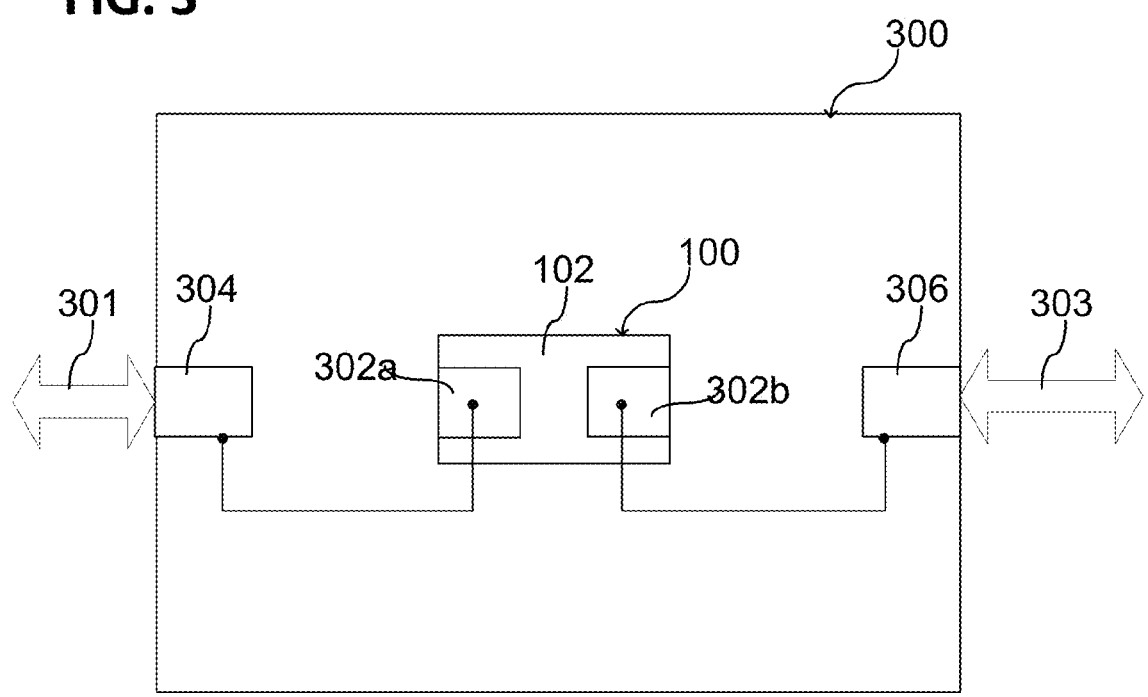
FIG. 3 shows a switching device in a schematic view, according to various embodiments.

FIG. 3 illustrates a schematic view (e.g. a top view) of a switching device 300 including a switch 100, as described before. According to various embodiments, the switching device 300 may include an antenna terminal 304; a switch 100 as described, for example, with reference to FIGS. 1 and 2 including a first switch terminal 302a and a second switch terminal 302b (e.g. a source/drain terminal), wherein the first switch terminal is coupled to the antenna terminal and wherein a transceiver terminal 306 is coupled to the second switch terminal 302b, wherein the transceiver terminal 306 is at least one of configured to provide (301, 303) a signal (e.g. an RF signal) received via the antenna terminal 304 or configured to receive (301, 303) a signal (e.g. an RF signal) to be transmitted via the antenna terminal 304. The switch 100 may be used to electrically connect and disconnect the antenna terminal 304 from the transceiver terminal 306, wherein the signal may be transferred linearly with low distortion.

In analogy, the switching device 300 may include a plurality of antenna terminals 304, e.g. two, three or more than three antenna terminals 304. Further, the switching device 300 may include a plurality of transceiver terminals 306, e.g. two, three, four, five, six, seven, eight, nine, or ten transceiver terminals 306, or more than 10 or more than 20 transceiver terminals 306. Accordingly, the switching device 300 may include a plurality of switches 100 (or transistors 100), e.g. two, three, four, five, six, seven, eight, nine, or ten switches 100, or more than 10 or more than 20 switches 100.

According to various embodiments, the terminals may be electrically conductively connected via metal lines or a metallization structure. The metal lines or the metallization structure may be formed over silicon 102 with low oxygen content as well, in analogy as described for the switch 100. Further, the switch 100 may be controlled via a control circuit being for example formed on the same carrier as the switch 100.

Figure 4A:
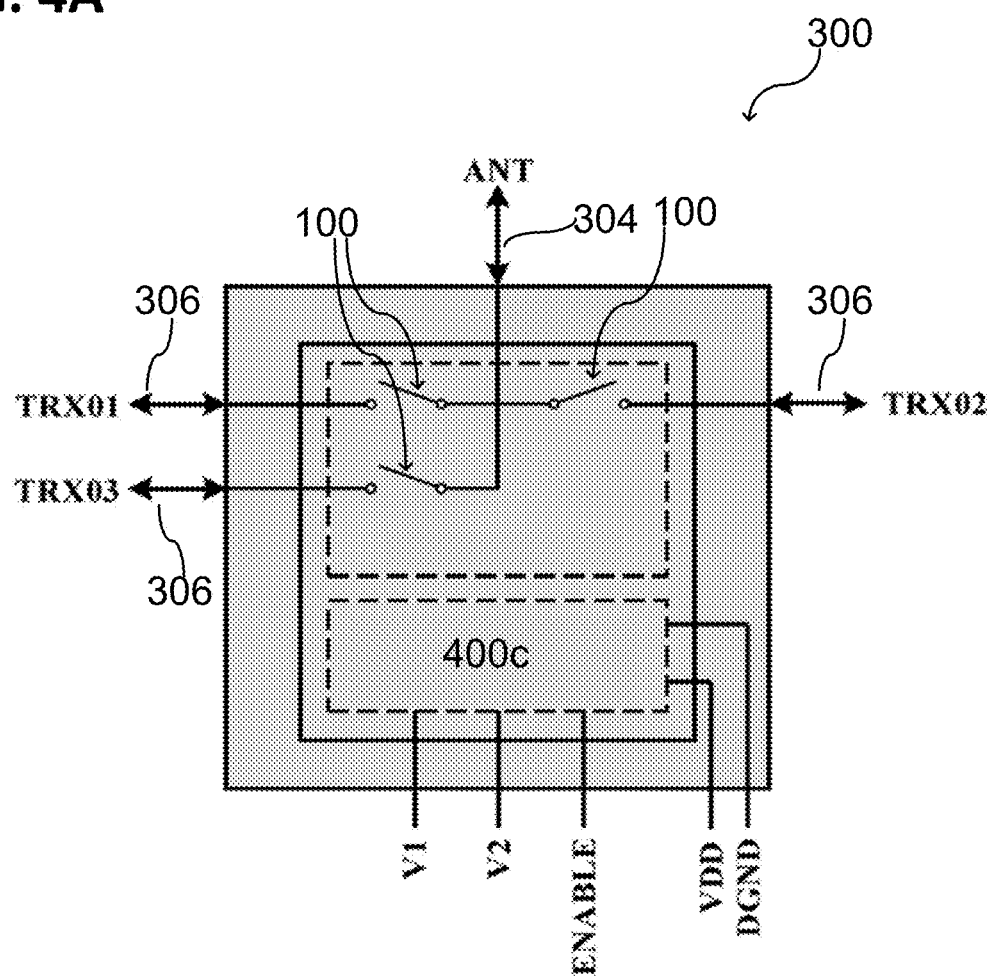
FIGS. 4A and 4B respectively show a switching device in a schematic view, according to various embodiments.

FIG. 4A illustrates a schematic view of a switching device 300, e.g. a single pole multi throw switch or an antenna switch modules (ASM), according to various embodiments. Further, the switching device 300 may include an RF MOS switch being suitable for a diversity of applications, e.g. for quadband GSM, EDGE, C2K, LTE, and/or W-CDMA applications. The switching device 300 may include three transceiver terminals (transceiver receiver ports TRX01, TRX02, TRX03), wherein any of the ports can be connected to a diversity antenna, e.g. handling up to 30 dBm.

According to various embodiments, the switching device 300 may include a control circuit 400c, e.g. an on-chip controller 400c which integrates CMOS logic and level shifters, driven by control inputs V1, V2 (e.g. from 1.5 V) to a Vdd terminal.

Further, the switching device 300 may include an integrated low-dropout or LDO regulator which may allow connecting the Vdd terminal directly to a battery; hence no regulated supply voltage may be required. Further, the switching device 300 may include an ESD protection. According to various embodiments, the switching device 300 may have a size of smaller than about 2×2 mm² and a maximum height of smaller than about 1 mm. According to various embodiments, the switches 100 of the switching device 300 may be addressed via the control inputs V1, V2.

Figure 4B:
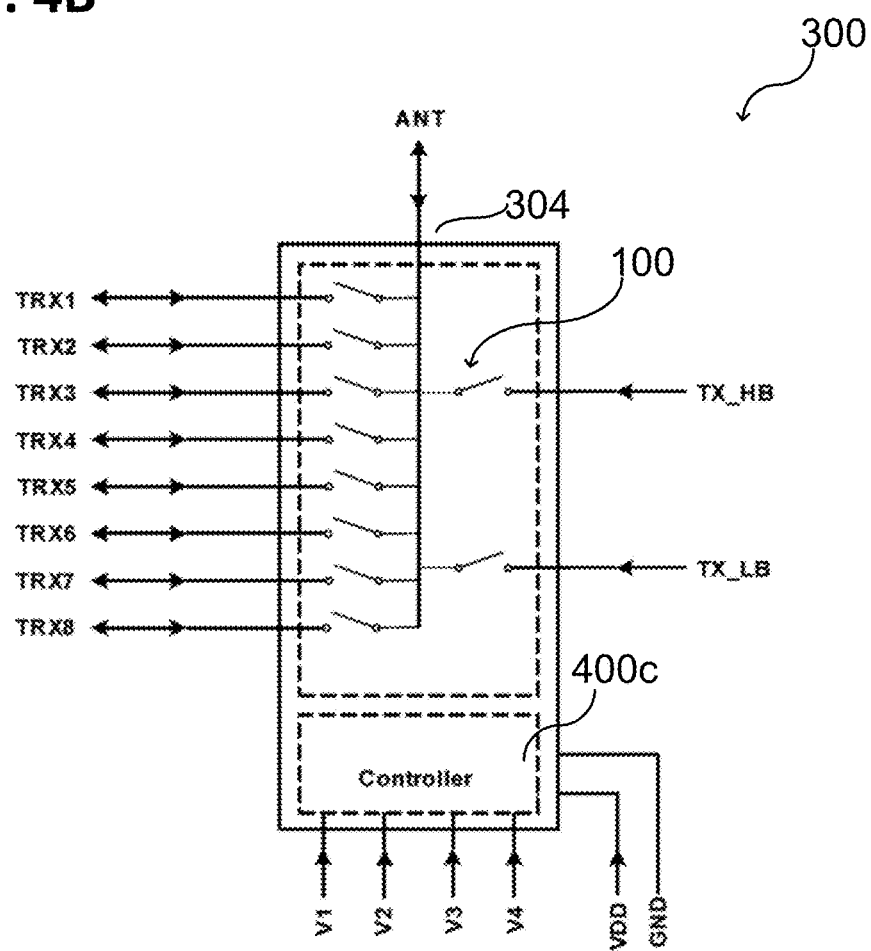

In analogy to FIG. 4A, FIG. 4B illustrates a schematic view of a switching device 300, e.g. a Single Pole Ten Throw (SP10T) switch 300 e.g. for wireless applications up to 3.8 GHz.

According to various embodiments, the switching device 300 may include an integrated General-purpose input/output (GPIO) controller. Further, the switching device 300 may include or may be coupled with harmonic filters for GSM high and low band transmit paths (TX_HB and RX_LB). The on-chip controller 400c may include CMOS logic and level shifters driven by control inputs V1, V2, V3, V4 (e.g. from 1.35 to 3.1 V). According to various embodiments, the switching device 300 may include ten switches 100 or transistors 100, as described herein. Accordingly, the switching device 300 may include ten transceiver (receiver) terminals (TRX1 to TRX8, TX_HB and RX_LB). The switching device 300 (the chip 300) may have a size of smaller than 4 mm×3 mm×1 mm.

Figure 5:
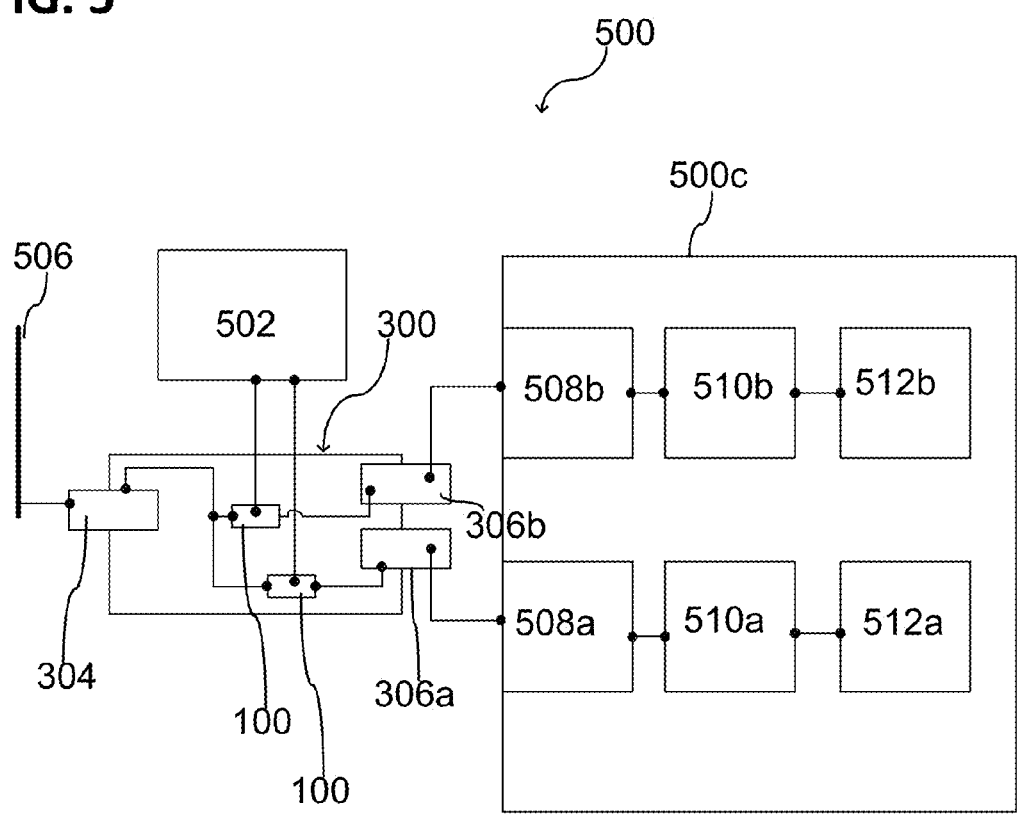
FIG. 5 shows a communication device in a schematic view, according to various embodiments.

FIG. 5 illustrates a schematic view of a communication device 500, e.g. a mobile phone, a tablet, a notebook, a smart phone, a receiver, a transmitter, a transceiver and the like, according to various embodiments.

According to various embodiments, a communication device 500 may include an antenna 506; and a switching device 300 or switching component 300 as described before, wherein the switching component includes an antenna terminal 304 coupled to the antenna 506 and one or more transceiver terminals 306a, 306b, wherein each of the one or more transceiver terminals 306a, 306b may be coupled to a signal processing unit 500c. According to various embodiments, the signal processing unit 500c may include for example a modulator/demodulator 508a, 508b for frequency modulation; a channel coder/decoder 510a, 510b for channel coding and decoding; and a baseband processing unit 512a, 512b.

Figure 6:
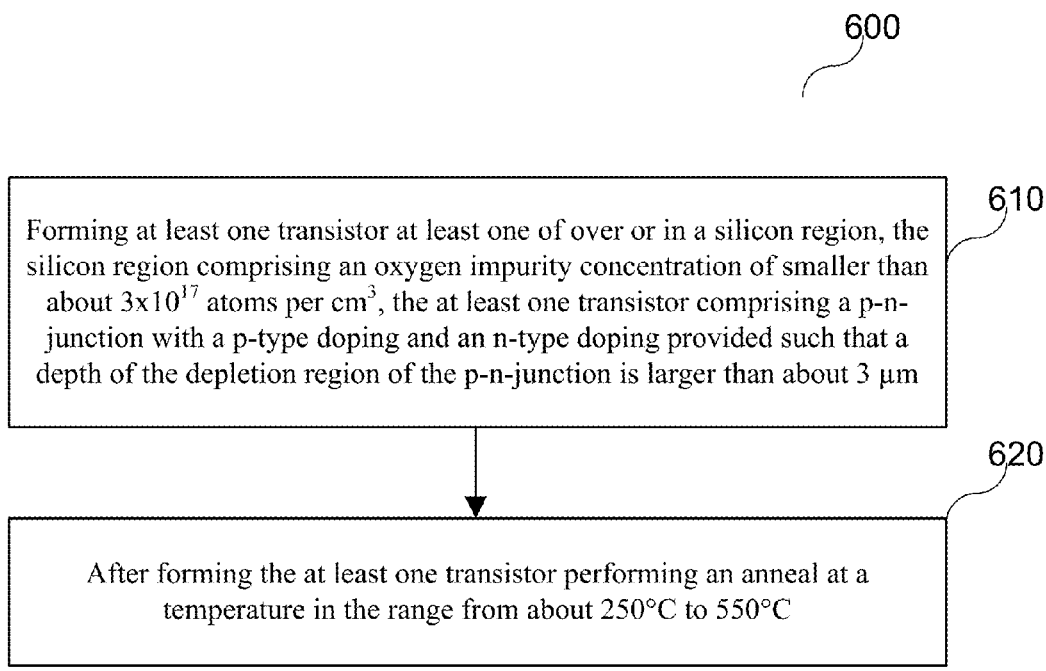
FIG. 6 shows a schematic flow diagram of a method for processing a carrier, according to various embodiments.

FIG. 6 illustrates a schematic flow diagram of a method 600 for processing a carrier or a wafer, according to various embodiments, wherein the method 600 may include: in 610, forming at least one transistor at least one of over or in a silicon region, the silicon region including an oxygen impurity concentration of smaller than about $3 \times 10^{17}$ atoms per cm³, the at least one transistor including a p-n-junction with a p-type doping and an n-type doping provided such that a depth of the depletion region of the p-n-junction is larger than about 3 µm, and, in 620, after forming the at least one transistor performing an anneal at a temperature in the range from about 250° C. to about 550° C.

According to various embodiments, commonly manufactured transistors, e.g. on CZ wafers, may be damaged or may degrade during a temperature annealing in a temperature range from about 250° C. to about 550° C., e.g. for longer than several minutes. Such a thermal treatment may be for example used for or may occur during formation of the metallization layers or the metal lines (generating the wiring) over the CMOS structures, e.g. over the transistor 100, as already described. As an example, during an annealing process in the temperature range from about 250° C. to about 550° C. oxygen included in the silicon material may be thermally activated a as n-type dopant, such that for example the p-type body regions get partially n-type doped an a large leakage current will flow from the drain/source regions of the transistor to the backside of the carrier. Further, if the doping (e.g. concentration, distribution or type of doping) of the silicon in the depletion zone is changed, the capacitive resistance of the depletion zone becomes strongly non-linear and disturbs the signal transmission through the transistor due to generation of higher harmonics with high power, cf. FIG. 2.

According to various embodiments, a method 600 for processing a wafer may include: forming a plurality of transistors at least one of over or in the wafer, the wafer including an oxygen impurity concentration of smaller than about $3 \times 10^{17}$ atoms per cm³, each transistor of the plurality of transistors including a p-n-junction, wherein a p-type doping and an n-type doping is provided such that a depth of the depletion region of the p-n-junction is larger than about 3 µm, after forming the plurality of transistors performing an anneal at a temperature in the range from about 250° C. to about 550° C.

According to various embodiments, a method 600 for processing a carrier may include: forming at least one silicon layer over the carrier, the silicon layer including a thickness of larger than 10 µm (and a width of lager than 30 µm), an oxygen impurity concentration of smaller than about $3 \times 10^{17}$ atoms per cm³, and a doping concentration of a first type of doping in the range from about $10^{12}$ atoms per cm³ to about $10^{14}$ atoms per cm³, doping at least two separated regions of the carrier with a second type of doping such that a p-n-junction is formed with a channel and a depletion region, wherein a depth of the depletion region is larger than about 3 µm, forming an electrically isolated gate region over the channel such that the a p-n-junction and the gate providing a transistor, performing an anneal at a temperature in the range from about 250° C. to about 550° C. subsequently.

According to various embodiments, performing an anneal may include forming at least one metallization layer. In other words, a method 600 for processing a carrier or a wafer may include forming at least one metallization layer, wherein forming at least one metallization layer may include a thermal processing which thermally activates oxygen donors, e.g. at temperatures in the range from about 250° C. to about 550° C., or e.g. in the range from about 350° C. to about 450° C.

According to various embodiments, forming at least one metallization layer may include forming a contact metallization, wherein the metallization (the wiring or the metal lines) may have a direct contact with at least one structure element (e.g. the transistor) provided on the carrier (or on the substrate, the wafer, and the like) to realize required electrical connections (or interconnections) for the structure elements provided on a carrier. According to various embodiments, a contact metallization process may include at least one layering process and/or at least one patterning process. According to various embodiments, a contact metallization process may include depositing a layer of a dielectric material (e.g. a low-k dielectric material, e.g. undoped silicate glass, and the like), forming contact holes at the desired locations (e.g. using a patterning process) and filling the holes with at least one electrically conductive material (e.g. at least one of a metal (e.g. aluminium, copper, tungsten, titanium, molybdenum, gold, and the like), a metallic material (e.g. titanium nitride, platinum silicide, titanium silicide, tungsten silicide, molybdenum silicide, and the like), electrically conductive silicon (e.g. electrically conductive polysilicon), and a metal alloy (e.g. aluminium-silicon alloys, aluminium-copper alloys, aluminium-silicon-copper alloys, nichrome, titanium-tungsten alloys, and the like)) using a layering process. Further, according to various embodiments, a contact metallization process (or a metallization process) may include forming additional layers for example as a barrier (e.g. including at least one of molybdenum, platinum silicide, titanium silicide, tungsten silicide, molybdenum silicide, borides, and the like), or as adhesion promoter (e.g. including at least one of platinum silicide, titanium silicide, tungsten silicide, molybdenum silicide, and the like). Further, according to various embodiments, the formation of a silicide may be self-aligned.

Further, according to various embodiments, forming at least one metallization layer may include forming a metallization, e.g. a single level metallization having one metal layer or a multilevel metallization including a plurality of metal layers, e.g. after the contact metallization may be provided.

According to various embodiments, a method 600 for processing a carrier may further include a packaging process. According to various embodiments, a method 600 for processing a carrier or a wafer may be at least a part of a method for manufacturing a switch, a switching device, a switching component, a communication device, as described herein.

According to various embodiments, the method 600 for processing a carrier or a wafer may include commonly applied CMOS technology, e.g. layering, doping, patterning, annealing, and the like.

According to various embodiments, a switching device may include: an antenna terminal; a switch including a first switch terminal and a second switch terminal, the first switch terminal coupled to the antenna terminal, the switch including at least one transistor at least one of over or in a silicon region including an oxygen impurity concentration of smaller than about $3 \times 10^{17}$ atoms per cm$^3$; and a transceiver terminal coupled to the second switch terminal, wherein the transceiver terminal is at least one of configured to provide a signal received via the antenna terminal or configured to receive a signal to be transmitted via the antenna terminal.

According to various embodiments, each transistor of the plurality of transistors including a p-n-junction extending or arranged at least partially in the silicon region, wherein a p-type doping and an n-type doping is provided such that a depth of the depletion region of the p-n-junction is larger than about 3 μm (or e.g. larger than about 5 μm).

According to various embodiments, a switching device may include: an antenna terminal; a switch including a first switch terminal and a second switch terminal, the first switch terminal coupled to the antenna terminal, the switch including at least one transistor at least one of over or in a silicon region including an oxygen impurity concentration of smaller than about $3 \times 10^{17}$ atoms per cm$^3$, each transistor of the plurality of transistors including a p-n-junction, wherein a p-type doping and an n-type doping is provided such that a depth of the depletion region of the p-n-junction is larger than about 3 μm (or e.g. larger than about 5 μm); and a transceiver terminal coupled to the second switch terminal, wherein the transceiver terminal is at least one of configured to provide a signal received via the antenna terminal or configured to receive a signal to be transmitted via the antenna terminal.

Further, according to various embodiments, the at least one transistor may include one or more metal-oxide-semiconductor field-effect transistors.

Further, according to various embodiments, the silicon region may include p-type doped silicon providing a body region of the at least one transistor with a doping concentration in the range from about $10^{12}$ atoms per cm$^3$ to about $10^{14}$ atoms per cm$^3$. Further, according to various embodiments, the silicon region may include n-type doped silicon providing a body region of the at least one transistor with a doping concentration in the range from about $10^{12}$ atoms per cm$^3$ to about $10^{14}$ atoms per cm$^3$.

Further, according to various embodiments, a specific electrical resistance of the p-type doped silicon is larger than about 100 Ωcm. Further, according to various embodiments, a specific electrical resistance of the n-type doped silicon is larger than about 100 Ωcm.

Further, according to various embodiments, a specific electrical resistance of the p-type doped silicon is larger than about 500 Ωcm. Further, according to various embodiments, a specific electrical resistance of the n-type doped silicon is larger than about 500 Ωcm.

Further, according to various embodiments, a specific electrical resistance of the p-type doped silicon is larger than about 1000 Ωcm. Further, according to various embodiments, a specific electrical resistance of the n-type doped silicon is larger than about 1000 Ωcm.

Further, according to various embodiments, the silicon region may include n-type doped silicon providing a source region and a drain region of the at least one transistor with a doping concentration in the range from about $10^{15}$ atoms per cm$^3$ to about $10^{23}$ atoms per cm$^3$, or with a doping concentration in the range from about $10^{19}$ atoms per cm$^3$ to about $10^{21}$ atoms per cm$^3$. Further, according to various embodiments, the silicon region may include p-type doped silicon providing a source region and a drain region of the at least one transistor with a doping concentration in the range from about $10^{15}$ atoms per cm$^3$ to about $10^{23}$ atoms per cm$^3$, or with a doping concentration in the range from about $10^{19}$ atoms per cm$^3$ to about $10^{21}$ atoms per cm$^3$.

Further, according to various embodiments, the switch may include one or more additional switch terminals. Further, the switching device may include one or more additional transceiver terminals coupled to the one or more additional switch terminals respectively, the switch being configured to electrically conductively connect at least one of the switch terminals to the antenna terminal.

According to various embodiments, a communication device may include: an antenna; a switching component, the switching component including: an antenna terminal; a switch including a first switch terminal and a second switch terminal, the first switch terminal coupled to the antenna terminal, the switch including at least one transistor at least one of over a silicon region including an oxygen impurity concentration of smaller than about $3 \times 10^{17}$ atoms per cm$^3$; and a transceiver terminal coupled to the second switch terminal, wherein the transceiver terminal is at least one of configured to provide a signal received via the antenna terminal or configured to receive a signal to be transmitted via the antenna terminal; wherein the antenna terminal is coupled to the antenna; and a signal processing unit coupled to the transceiver terminal.

According to various embodiments, a communication device may include: an antenna; a switching component, the switching component including: an antenna terminal; a switch including a first switch terminal and a second switch terminal, the first switch terminal coupled to the antenna terminal, the switch including at least one transistor at least one of over a silicon region including an oxygen impurity concentration of smaller than about $3 \times 10^{17}$ atoms per cm$^3$, each transistor of the plurality of transistors including a p-n-junction, wherein a p-type doping and an n-type doping is provided such that a depth of the depletion region of the p-n-junction is larger than about 3 μm (or e.g. larger than about 5 μm); and a transceiver terminal coupled to the second switch terminal, wherein the transceiver terminal is at least one of configured to provide a signal received via the antenna terminal or configured to receive a signal to be transmitted via the antenna terminal; wherein the antenna terminal is coupled to the antenna; and a signal processing unit coupled to the transceiver terminal.

According to various embodiments, a communication device may include: an antenna; a switching component, the switching component including: an antenna terminal; a switch including a first switch terminal and a second switch terminal, the first switch terminal coupled to the antenna terminal, the switch including at least one transistor at least one of over a silicon region including an oxygen impurity concentration of smaller than about $3 \times 10^{17}$ atoms per $cm^3$; and a transceiver terminal coupled to the second switch terminal, wherein the transceiver terminal is at least one of configured to provide a signal received via the antenna terminal or configured to receive a signal to be transmitted via the antenna terminal; wherein the antenna terminal is coupled to the antenna; and a signal processing unit coupled to the transceiver terminal.

Further, according to various embodiments, the processing unit may include at least one component of the following group of components, the group consisting of: a modulator for frequency modulation; a demodulator for frequency demodulation; a channel coder for channel coding; a channel decoder for channel decoding; and a baseband processing unit.

Further, according to various embodiments, the switch may include one or more additional switch terminals. Further, the switching component may include one or more additional transceiver terminals coupled to the one or more additional switch terminals respectively, and the communication device may include one or more additional signal processing units coupled to the one or more additional transceiver terminals respectively, wherein the switch is configured to electrically conductively connect at least one of the switch terminals to the antenna terminal.

According to various embodiments, a method for processing a carrier may include forming at least one transistor at least one of over or in a silicon region, the silicon region including an oxygen impurity concentration of smaller than about $3 \times 10^{17}$ atoms per $cm^3$, the at least one transistor including a p-n-junction with a p-type doping and an n-type doping provided such that a depth of the depletion region of the p-n-junction is larger than about 3 µm, and after forming the at least one transistor performing an anneal or a heat treatment at a temperature in the range from about 250° C. to about 550° C.

According to various embodiments, a method for processing a carrier may include forming at least one transistor at least one of over or in a silicon region, the silicon region including an oxygen impurity concentration of smaller than about $3 \times 10^{17}$ atoms per $cm^3$, and after forming the at least one transistor performing an anneal or a heat treatment at a temperature in the range from about 250° C. to about 550° C.

Further, according to various embodiments, the at least one transistor may be formed at least one of over or in a silicon wafer providing the silicon region, the silicon wafer including an oxygen impurity concentration of smaller than about $3 \times 10^{17}$ atoms per $cm^3$.

Further, according to various embodiments, the at least one transistor may be formed at least one of over or in a silicon layer providing the silicon region, the silicon layer including an oxygen impurity concentration of smaller than about $3 \times 10^{17}$ atoms per $cm^3$. The silicon layer may have a thickness larger than about 10 µm, e.g. larger than about 20 µm, e.g. larger than about 30 µm, e.g. larger than about 60 µm.

Further, according to various embodiments, the silicon layer may be formed via depositing silicon over a carrier by applying at least one of a physical vapor deposition process or a chemical vapor deposition process.

Further, according to various embodiments, the silicon region may include at least one first-type doped body region with a doping concentration of in the range from about $10^{12}$ atoms per $cm^3$ to about $10^{14}$ atoms per $cm^3$, and the silicon region may include at least one second-type doped source region and at least one second-type doped drain region with a doping concentration in the range from about $10^{15}$ atoms per $cm^3$ to about $10^{23}$ atoms per $cm^3$ respectively, the at least one body region, the at least one source region and the at least one drain region forming the at least one transistor.

According to various embodiments, the silicon layer may be formed via deposition already doped silicon or the silicon layer may be doped after the deposition via ion implantation and/or diffusion.

Further, according to various embodiments, the at least one first-type doped body region may be p-type doped and the at least one source region and the at least one drain region are n-type doped. Further, according to various embodiments, the at least one first-type doped body region may be n-type doped and the at least one source region and the at least one drain region are p-type doped.

Further, according to various embodiments, a specific electrical resistance of the at least one first-type doped body region may be larger than about 100 Ωcm, or larger than about 500 Ωcm, or larger than about 1000 Ωcm.

Further, according to various embodiments, forming at least one transistor may include forming one or more metal-oxide-semiconductor field-effect transistors.

According to various embodiments, the method for processing a carrier may further include: after forming the at least one transistor forming a metallization structure over the at least one transistor electrically contacting the at least one transistor.

Further, according to various embodiments, performing an anneal may include performing the anneal for more than 1 min at temperatures greater than 300° C. Further, according to various embodiments, performing an anneal may include performing the anneal for more than 5 min at temperatures greater than 400° C. Further, according to various embodiments, performing an anneal may include performing the anneal for more than 10 min at temperatures greater than 300° C. Further, according to various embodiments, performing an anneal may include performing the anneal for more than 10 min at temperatures greater than 400° C.

According to various embodiments, a method for processing a wafer may include: forming a plurality of transistors at least one of over or in the wafer, the wafer including an oxygen impurity concentration of smaller than about $3 \times 10^{17}$ atoms per $cm^3$, each transistor of the plurality of transistors including a p-n-junction, wherein a p-type doping and an n-type doping is provided such that a depth of the depletion region of the p-n-junction is larger than about 3 µm, after forming the plurality of transistors performing an anneal at a temperature in the range from about 250° C. to about 550° C.

According to various embodiments, a method for processing a carrier may include: forming at least one silicon layer over the carrier, the silicon layer including a thickness of larger than 10 µm (and a width of lager than 30 µm), an oxygen impurity concentration of smaller than about $3 \times 10^{17}$ atoms per $cm^3$, and a doping concentration of a first type of doping in the range from about $10^{12}$ atoms per $cm^3$ to about $10^{14}$ atoms per $cm^3$, doping at least two separated regions of the carrier with a second type of doping such that a p-n-junction is formed with a channel and a depletion region, wherein a depth of the depletion region is larger than about 3 µm, forming an electrically isolated gate region over the channel such that the a p-n-junction and the gate providing a transistor, performing an anneal at a temperature in the range from about 250° C. to about 550° C. subsequently.

According to various embodiments, an electronic device may include: a carrier; at least one p-n-junction disposed at least one of over or in carrier, the p-n-junction inducing at least one depletion region extending within a surface region of the carrier; wherein a p-type doping and an n-type doping of the p-n-junction is provided such that a depth of the depletion region is larger than about 3 µm, wherein a carrier material forming the surface region includes silicon and an oxygen impurity in the silicon of smaller than about $3 \times 10^{17}$ atoms per $cm^3$, and wherein a specific electrical resistance of the carrier material forming the surface region is larger than 100 Ωcm.

According to various embodiments, the depletion region of the one or more transistors may extend into the silicon region including an oxygen impurity concentration of smaller than about $3 \times 10^{17}$ atoms per $cm^3$.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A switching device, comprising:
    an antenna terminal;
    a switch comprising a first switch terminal and a second switch terminal, the first switch terminal coupled to the antenna terminal, the switch comprising at least one transistor at least one of over or in a silicon region comprising an oxygen impurity concentration of smaller than about 3×10 atoms per cm; and
    a transceiver terminal coupled to the second switch terminal, wherein the transceiver terminal is at least one of configured to provide a signal received via the antenna terminal or configured to receive a signal to be transmitted via the antenna terminal,
    wherein each transistor of the plurality of transistors comprising a p-n junction extending at least partially in the silicon region, wherein a p type doping and an n type doping is provided such that a depth of the depletion region of the p-n junction is larger than about 3 µm;
    wherein the silicon region comprises at least one first-type doped body region with a doping concentration of in the range from about $10^{12}$ atoms per $cm^3$ to about $10^{14}$ atoms per $cm^3$, and
    wherein the silicon region comprises at least one second-type doped source region and at least one second-type doped drain region with a doping concentration in the range from about $10^{15}$ atoms per $cm^3$ to about $10^{23}$ atoms per cm respectively, the at least one body region, the at least one source region and the at least one drain region forming the at least one transistor.

2. The switching device according to claim 1,
    wherein the silicon region comprises p-type doped silicon providing a body region of the at least one transistor with a doping concentration in the range from about $10^{12}$ atoms per $cm^3$ to about $10^{14}$ atoms per $cm^3$.

3. The switching device according to claim 2,
    wherein a specific electrical resistance of the p-type doped silicon is larger than about 100 Ωcm.

4. The switching device according to claim 1,
    wherein the silicon region comprises n-type doped silicon providing a source region and a drain region of the at least one transistor with a doping concentration in the range from about $10^{15}$ atoms per $cm^3$ to about $10^{23}$ atoms per $cm^3$.

5. The switching device according to claim 1,
    wherein the switch comprises one or more additional switch terminals, and
    wherein the switching device comprises one or more additional transceiver terminals coupled to the one or more additional switch terminals respectively, the switch being configured to electrically conductively connect at least one of the switch terminals to the antenna terminal.

6. A communication device, comprising:
    an antenna;
    a switching component, comprising:
    an antenna terminal;
    a switch comprising a first switch terminal and a second switch terminal, the first switch terminal coupled to the antenna terminal, the switch comprising at least one transistor at least one of over or in a silicon region comprising an oxygen impurity concentration of smaller than about $3 \times 10^{17}$ atoms per $cm^3$; and
    a transceiver terminal coupled to the second switch terminal, wherein the transceiver terminal is at least one of configured to provide a signal received via the antenna terminal or configured to receive a signal to be transmitted via the antenna terminal;
    wherein the antenna terminal is coupled to the antenna; and
    a signal processing unit coupled to the transceiver terminal,
    wherein the at least one transistor comprises a p-n junction extending at least partially in the silicon region, wherein a p-type doping and an n-type doping is provided such that a depth of the depletion region of the p-n junction is larger than about 3 µm;
    wherein the silicon region comprises at least one first-type doped body region with a doping concentration of in the range from about $10^{12}$ atoms per $cm^3$ to about $10^{14}$ atoms per $cm^3$, and
    wherein the silicon region comprises at least one second-type doped source region and at least one second-type doped drain region with a doping concentration in the range from about $10^{15}$ atoms per $cm^3$ to about $10^{23}$ atoms per cm respectively, the at least one body region, the at least one source region and the at least one drain region forming the at least one transistor.

7. The communication device according to claim 6,
    wherein the processing unit comprises at least one component of the following group of components, the group consisting of:
    a modulator for frequency modulation;
    a demodulator for frequency demodulation;
    a channel coder for channel coding;
    a channel decoder for channel decoding; and
    a baseband processing unit.

8. The communication device according to claim 6,
wherein the switch comprises one or more additional switch terminals,
wherein the switching component comprises one or more additional transceiver terminals coupled to the one or more additional switch terminals respectively, and
wherein the communication device comprises one or more additional signal processing units coupled to the one or more additional transceiver terminals respectively, the switch being configured to electrically conductively connect at least one of the switch terminals to the antenna terminal.

9. A method for processing a carrier, the method comprising:
forming at least one transistor at least one of over or in a silicon region, the silicon region comprising an oxygen impurity concentration of smaller than about $3 \times 10^{17}$ atoms per $cm^3$, the at least one transistor comprising a p-n-junction with a p-type doping and an n-type doping provided such that a depth of the depletion region of the p-n-junction is larger than about 3 μm, and
after forming the at least one transistor performing an anneal at a temperature in the range from about 250° C. to about 550° C.;
wherein the silicon region comprises at least one first-type doped body region with a doping concentration of in the range from about $10^{12}$ atoms per $cm^3$ to about $10^{14}$ atoms per $cm^3$, and
wherein the silicon region comprises at least one second-type doped source region and at least one second-type doped drain region with a doping concentration in the range from about $10^{15}$ atoms per $cm^3$ to about $10^{23}$ atoms per cm respectively, the at least one body region, the at least one source region and the at least one drain region forming the at least one transistor.

10. The method according to claim 9,
wherein the at least one transistor is formed at least one of over or in a silicon wafer providing the silicon region, the silicon wafer comprising an oxygen impurity concentration of smaller than about $3 \times 10^{17}$ atoms per $cm^3$.

11. The method according to claim 9,
wherein the at least one transistor is formed at least one of over or in a silicon layer providing the silicon region, the silicon layer comprising an oxygen impurity concentration of smaller than about $3 \times 10^{17}$ atoms per $cm^3$.

12. The method according to claim 11,
wherein the silicon layer is formed via depositing silicon over a carrier by applying at least one of a physical vapor deposition process or a chemical vapor deposition process.

13. The method according to claim 9, the at least one source region and the at least one drain region are n-type doped.

14. The method according to claim 9,
wherein the at least one first-type doped body region is n-type doped and wherein the at least one source region and the at least one drain region are p-type doped.

15. The method according to claim 9,
wherein a specific electrical resistance of the at least one first-type doped body region is larger than about 100 Ωcm.

16. The method according to claim 9,
wherein forming at least one transistor comprises forming one or more metal-oxide-semiconductor field-effect transistors.

17. The method according to claim 9, further comprising:
after forming the at least one transistor forming a metallization structure over the at least one transistor electrically contacting the at least one transistor.

18. The method according to claim 9,
wherein performing an anneal comprises performing the anneal for more than 1 min at temperatures greater than 300° C.

* * * * *

UNITED STATES PATENT AND TRADEMARK OFFICE
CERTIFICATE OF CORRECTION

PATENT NO. : 9,882,600 B2  
APPLICATION NO. : 14/172925  
DATED : January 30, 2018  
INVENTOR(S) : Christian Kuehn et al.

Page 1 of 1

It is certified that error appears in the above-identified patent and that said Letters Patent is hereby corrected as shown below:

In the Claims

Column 15, Line 45 Claim 1: Delete "about $3\times10$ atoms per cm;" and write --about $3\times10^{17}$ atoms per $cm^3$;-- in place thereof.

Column 15, Line 65 Claim 1: Delete "atoms per cm respectively" and write --atoms per $cm^3$ respectively-- in place thereof.

Column 16, Line 56 Claim 6: Delete "atoms per cm respectively" and write --atoms per $cm^3$ respectively-- in place thereof.

Column 17, Line 33 Claim 9: Delete "atoms per cm respectively" and write --atoms per $cm^3$ respectively-- in place thereof.

Column 18, Line 14 Claim 13: Delete "claim 9, the at least one" and write --claim 9, wherein the at least one first-type doped body region is p-type doped and wherein the at least one-- in place thereof.

Signed and Sealed this  
Twenty-seventh Day of November, 2018

Andrei Iancu  
*Director of the United States Patent and Trademark Office*